US011244972B2

(12) United States Patent
Liu et al.

(10) Patent No.: US 11,244,972 B2
(45) Date of Patent: Feb. 8, 2022

(54) ARRAY SUBSTRATE, METHOD FOR MANUFACTURING THE SAME AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Ning Liu, Beijing (CN); Bin Zhou, Beijing (CN); Jun Liu, Beijing (CN); Qinghe Wang, Beijing (CN); Wei Song, Beijing (CN); Wei Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/859,558

(22) Filed: Apr. 27, 2020

(65) Prior Publication Data
US 2021/0175263 A1    Jun. 10, 2021

(30) Foreign Application Priority Data
Dec. 4, 2019 (CN) .......................... 201911227758.8

(51) Int. Cl.
*H01L 21/00* (2006.01)
*H01L 27/00* (2006.01)
(Continued)

(52) U.S. Cl.
CPC .... *H01L 27/1288* (2013.01); *H01L 21/02565* (2013.01); *H01L 27/1225* (2013.01);
(Continued)

(58) Field of Classification Search
CPC ......... H01L 21/02565; H01L 21/32139; H01L 21/0274; H01L 21/76802; H01L 21/02521;
(Continued)

(56) References Cited

U.S. PATENT DOCUMENTS 8,603,914 B2 * 12/2013 Song ................ G02F 1/134363
438/670
2006/0024895 A1    2/2006 Kim
(Continued)

FOREIGN PATENT DOCUMENTS

CN    108538860 A    9/2018
CN    109935516 A    6/2019

OTHER PUBLICATIONS

First Office Action dated Nov. 10, 2021 corresponding to Chinese application No. 201911227758.8.

*Primary Examiner* — Nikolay K Yushin
(74) *Attorney, Agent, or Firm* — Nath, Goldberg & Meyer; Joshua B. Goldberg

(57) ABSTRACT

An array substrate, a method for manufacturing the same and a display device are provided. The method includes: providing a base substrate; forming a conductive material thin film on the base substrate; forming a first photoresist layer on a side of the conductive material thin film distal to the base substrate; etching the conductive material thin film by using the first photoresist layer as a mask to obtain a first etched pattern; removing third covering portions of the first photoresist layer to obtain a second photoresist layer; and etching the first etched pattern by using the second photoresist layer as a mask to obtain a gate electrode and a signal line.

13 Claims, 8 Drawing Sheets

(51) Int. Cl.
*H01L 29/00* (2006.01)
*H01L 27/12* (2006.01)
*H01L 21/02* (2006.01)
*H01L 29/24* (2006.01)
*H01L 29/66* (2006.01)
*H01L 29/786* (2006.01)

(52) U.S. Cl.
CPC .......... *H01L 27/1244* (2013.01); *H01L 29/24* (2013.01); *H01L 29/66969* (2013.01); *H01L 29/7869* (2013.01); *H01L 29/78633* (2013.01)

(58) Field of Classification Search
CPC ............. H01L 27/1288; H01L 27/1225; H01L 27/1244; H01L 29/24; H01L 29/66969; H01L 29/78633; H01L 29/7869
See application file for complete search history.

(56) References Cited

U.S. PATENT DOCUMENTS

2008/0213472 A1\* 9/2008 Song ................... G02F 1/13458
427/162
2017/0162822 A1\* 6/2017 Park .................... H01L 51/5246

\* cited by examiner

ARRAY SUBSTRATE, METHOD FOR MANUFACTURING THE SAME AND DISPLAY DEVICE

CROSS-REFERENCE TO RELATED APPLICATIONS

The present disclosure claims the priority of Chinese Patent Application No. 201911227758.8, filed on Dec. 4, 2019, the content of which is incorporated herein by reference in its entirety.

TECHNICAL FIELD

The present disclosure relates to the field of display technology, and in particular relates to a method for manufacturing an array substrate, an array substrate and a display device.

BACKGROUND

So far, a top-gate type thin film transistor (TFT) has a short channel, therefore an on-state current of the top-gate type thin film transistor has been effectively increased, thereby significantly improving a display effect and effectively reducing power consumption.

SUMMARY

As an aspect, a method for manufacturing an array substrate is provided. The method includes: providing a base substrate; forming a conductive material thin film on the base substrate; forming a first photoresist layer on a side of the conductive material thin film distal to the base substrate, wherein the first photoresist layer comprises a first covering portion corresponding to a gate electrode, a second covering portion corresponding to a signal line, and third covering portions which are respectively on two sides of the second covering portion and connected with the second covering portion, and a thickness of each of the third covering portions is smaller than a thickness of the second covering portion; etching the conductive material thin film by using the first photoresist layer as a mask to obtain a first etched pattern; removing the third covering portions of the first photoresist layer to obtain a second photoresist layer; and etching the first etched pattern by using the second photoresist layer as a mask to obtain the gate electrode and the signal line.

In an embodiment, forming the first photoresist layer on the side of the conductive material thin film distal to the base substrate includes: forming a photoresist thin film on the side of the conductive material thin film distal to the base substrate, exposing the photoresist thin film by using a halftone mask, and developing the exposed photoresist thin film to obtain the first photoresist layer.

In an embodiment, removing the third covering portions of the first photoresist layer includes: performing an ashing process on the first photoresist layer to remove the third covering portions of the first photoresist layer.

In an embodiment, etching the conductive material thin film by using the first photoresist layer as a mask to obtain a first etched pattern includes: etching the conductive material thin film by using the first photoresist layer as a mask, such that an orthographic projection of the first etched pattern on the base substrate extends throughout the base substrate.

In an embodiment, the halftone mask includes a complete-light-transmitting region, two light shielding regions and two semi-light-transmitting regions. An orthographic projection of a first light shielding region of the two light shielding regions on the base substrate overlaps an orthographic projection of the gate electrode on the base substrate, and an orthographic projection of a second light shielding region of the two light shielding regions on the base substrate overlaps an orthographic projection of the signal line on the base substrate. The two semi-light-transmitting regions are respectively on two sides of the second light shielding region.

In an embodiment, before forming the conductive material thin film on the base substrate, the method further includes: sequentially forming a light shielding layer, a buffer layer, an active layer and a gate insulation material on the base substrate.

In an embodiment, after etching the first etched pattern by using the second photoresist layer as a mask to obtain the gate electrode and the signal line, the method further includes: etching the gate insulation material by using the second photoresist layer as a mask to obtain a gate insulation layer.

In an embodiment, etching the gate insulation material by using the second photoresist layer as a mask to obtain the gate insulation layer includes: etching the gate insulation material through a self-alignment process.

In an embodiment, after etching the gate insulation material by using the second photoresist layer as a mask to obtain the gate insulation layer, the method further includes: performing a conductorization process on a region of the active layer not covered by the gate insulation layer; and removing the second photoresist layer.

In an embodiment, after performing the conductorization process on the region of the active layer not covered by the gate insulation layer, the method further includes: sequentially forming an interlayer dielectric layer, a source electrode and a drain electrode on the base substrate.

In an embodiment, the active layer is made of indium gallium zinc oxide.

As an aspect, an array substrate manufactured by the method for manufacturing an array substrate above is provided.

As an aspect, a display device including the above array substrate is provided.

DETAILED DESCRIPTION

To enable one of ordinary skill in the art to better understand the technical solutions of the present disclosure, a method for manufacturing an array substrate, an array substrate and a display device provided by the present disclosure will be further described in detail below with reference to the accompanying drawings.

In an actual process, after exposure, etching and patterning processes on a gate layer are completed, a gate insulation layer below the gate layer needs to be etched through a self-alignment process, and then a conductorization process is performed on an active layer. In order to prevent helium plasma from laterally diffusing in a channel of the active layer and prevent metal atoms in the gate electrode above the active layer from diffusing into the channel through two sides of the active layer during the conductorization process, a difference between a line width of the etched gate electrode and a line width of photoresist is made large, so that the photoresist can better protect the gate insulation layer on a left side and right side below a pattern of the gate electrode from being etched, thereby protecting the conducing process performed on the active layer below the pattern of the gate electrode, effectively preventing the helium plasma from laterally diffusing in a channel of the active layer and metal atoms in the gate electrode above the active layer from diffusing into the channel through two sides of the active layer during the conductorization process of the active layer, and ensuring the stability of the characteristics of the TFT.

However, with the gradual development of display products towards large size and high pixel density (Pixels Per Inch, PPI for short), an increasing density of metal wirings is required, which requires in a process that a line width of the photoresist formed by exposure is as close as possible to a line width of the final etched gate electrode. On one hand, the conductivity of the display products can be enhanced; on the other hand, the high frequency of wire break due to too narrow line width after etching can be prevented. This is in contradiction with the large difference between the line width of the etched gate electrode of the TFT and the line width of the photoresist.

Figure 1:
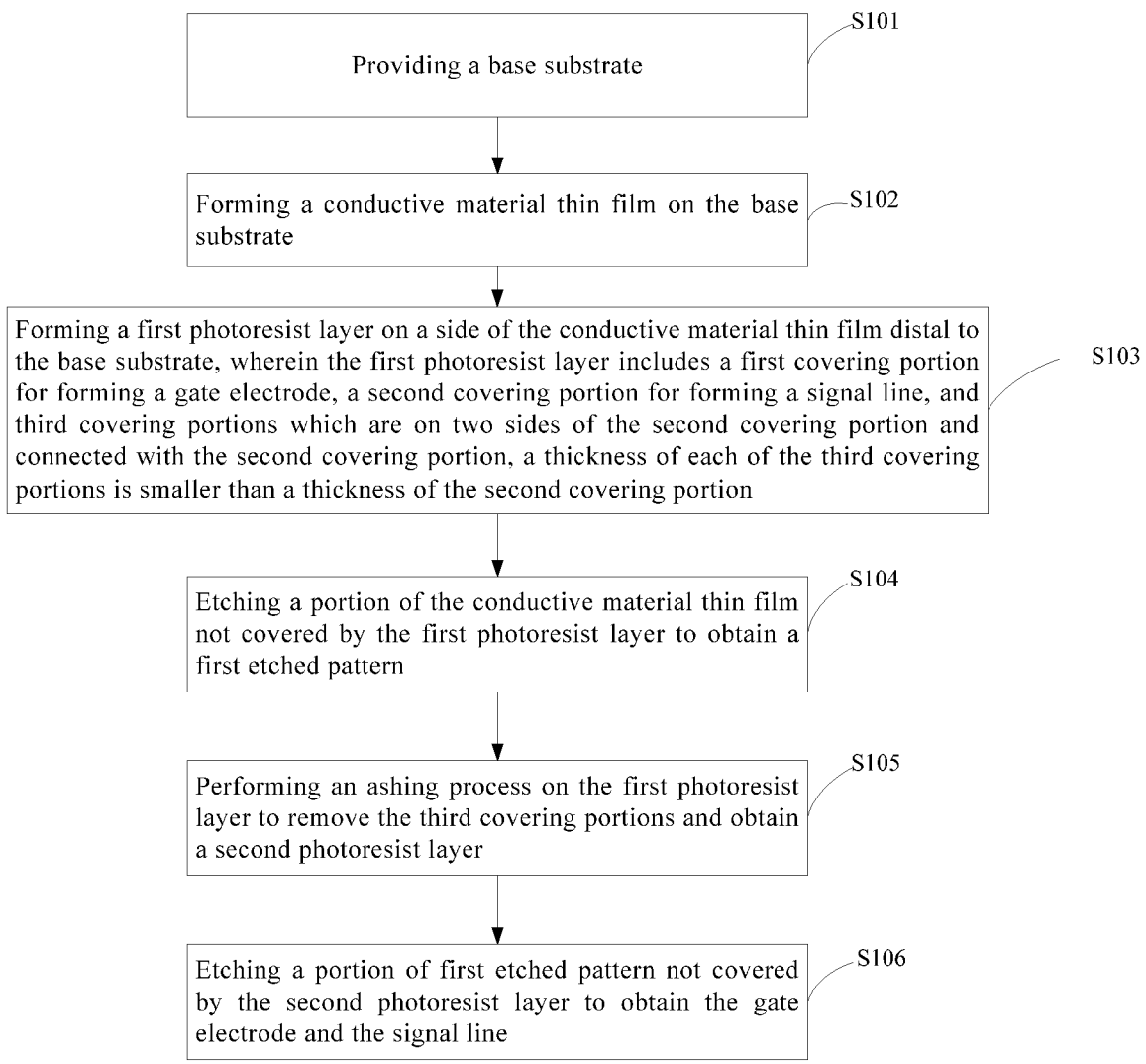
FIG. 1 is a flowchart of a method for manufacturing an array substrate according to an embodiment of the present disclosure.

FIG. 1 is a flowchart of a method for manufacturing an array substrate according to an embodiment of the present disclosure. As shown in FIG. 1, the method for manufacturing the array substrate includes step S101 to step S106.

At step S101, a base substrate is provided.

At step S102, a conductive material thin film is formed on the base substrate.

At step S103, a first photoresist layer is formed on a side of the conductive material thin film distal to the base substrate. The first photoresist layer includes a first covering portion for forming a gate electrode, a second covering portion for forming a signal line, and third covering portions which are on two sides of the second covering portion and connected with the second covering portion. A thickness of each of the third covering portions is smaller than a thickness of the second covering portion.

At step S104, the conductive material thin film is etched by using the first photoresist layer as a mask to obtain a first etched pattern.

At step S105, an ashing process is performed on the first photoresist layer to remove the third covering portions and obtain a second photoresist layer.

At step S106: the first etched pattern is etched by using the second photoresist layer as a mask to obtain a gate electrode and a signal line.

According to the method for manufacturing the array substrate in the embodiment, regions on two sides of the conductive material thin film covered by the first covering portion are etched twice, and regions on two sides of the conductive material thin film covered by the second covering portion are etched once, so that a difference between a line width of the etched gate electrode and a line width of the photoresist is large, and a difference between a line width of the etched signal line and a line width of the photoresist is small, thereby preventing the high frequency of wire break due to too narrow line width of the etched signal line, enhancing the conductivity of the signal line, and improving the quality of display products.

Figure 2:
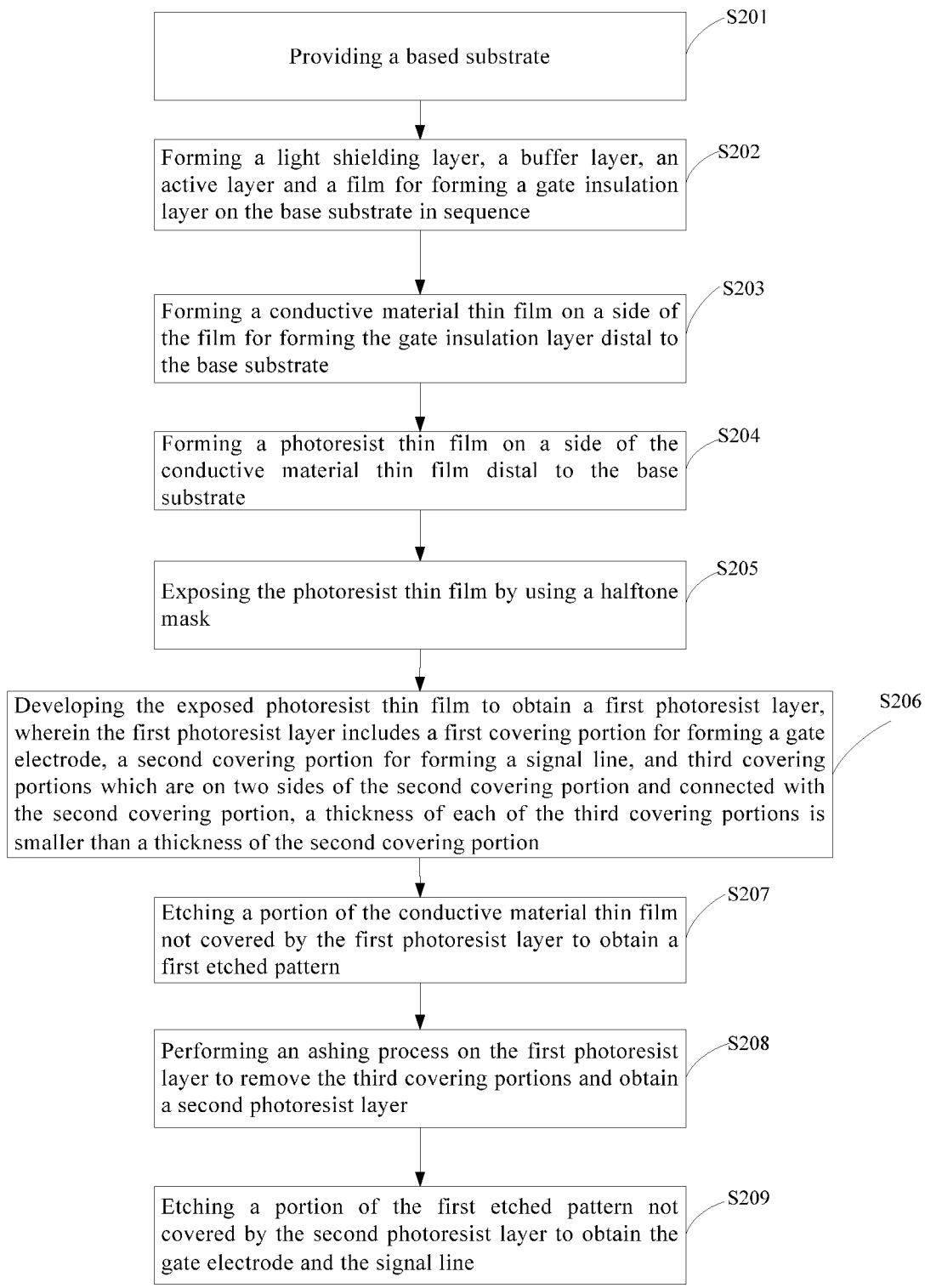
FIG. 2 is a flowchart of a method for manufacturing an array substrate according to an embodiment of the present disclosure.

FIG. 2 is a flowchart of a method for manufacturing an array substrate according to an embodiment of the present disclosure. In the embodiment shown in FIG. 2, the method for manufacturing an array substrate includes step S201 to step S209.

At step S201, a based substrate is provided.

At step S202, a light shielding layer, a buffer layer, an active layer and a gate insulation material for forming a gate insulation layer are sequentially formed on the base substrate.

At step S203, a conductive material thin film is formed on a side of the gate insulation material distal to the base substrate.

At step S204, a photoresist thin film is formed on a side of the conductive material thin film distal to the base substrate.

At step S205, the photoresist thin film is exposed by using a halftone mask.

At step S206, the exposed photoresist thin film is developed to obtain a first photoresist layer. The first photoresist layer includes a first covering portion for forming a gate electrode, a second covering portion for forming a signal line, and third covering portions which are on two sides of the second covering portion and connected with the second covering portion. A thickness of each of the third covering portions is smaller than a thickness of the second covering portion.

At step S207, the conductive material thin film is etched by using the first photoresist layer as a mask to obtain a first etched pattern.

At step S208, an ashing process is performed on the first photoresist layer to remove the third covering portions and obtain a second photoresist layer.

At step S209, the first etched pattern is etched by using the second photoresist layer as a mask until a gate insulation material 5 is exposed, so as to obtain a gate electrode and a signal line.

According to the method for manufacturing the array substrate in the embodiment, the photoresist thin film is exposed by using the halftone mask, so that the photoresist thin film can be incompletely exposed. The amount of light passing through a semi-light-transmitting film of the halftone mask depends on a height difference required by a passivation layer. Compared with a traditional mask, the production process is simplified, the production cost is reduced, the production period is shortened, the production efficiency is improved, and the production flow is simplified.

Figure 3:
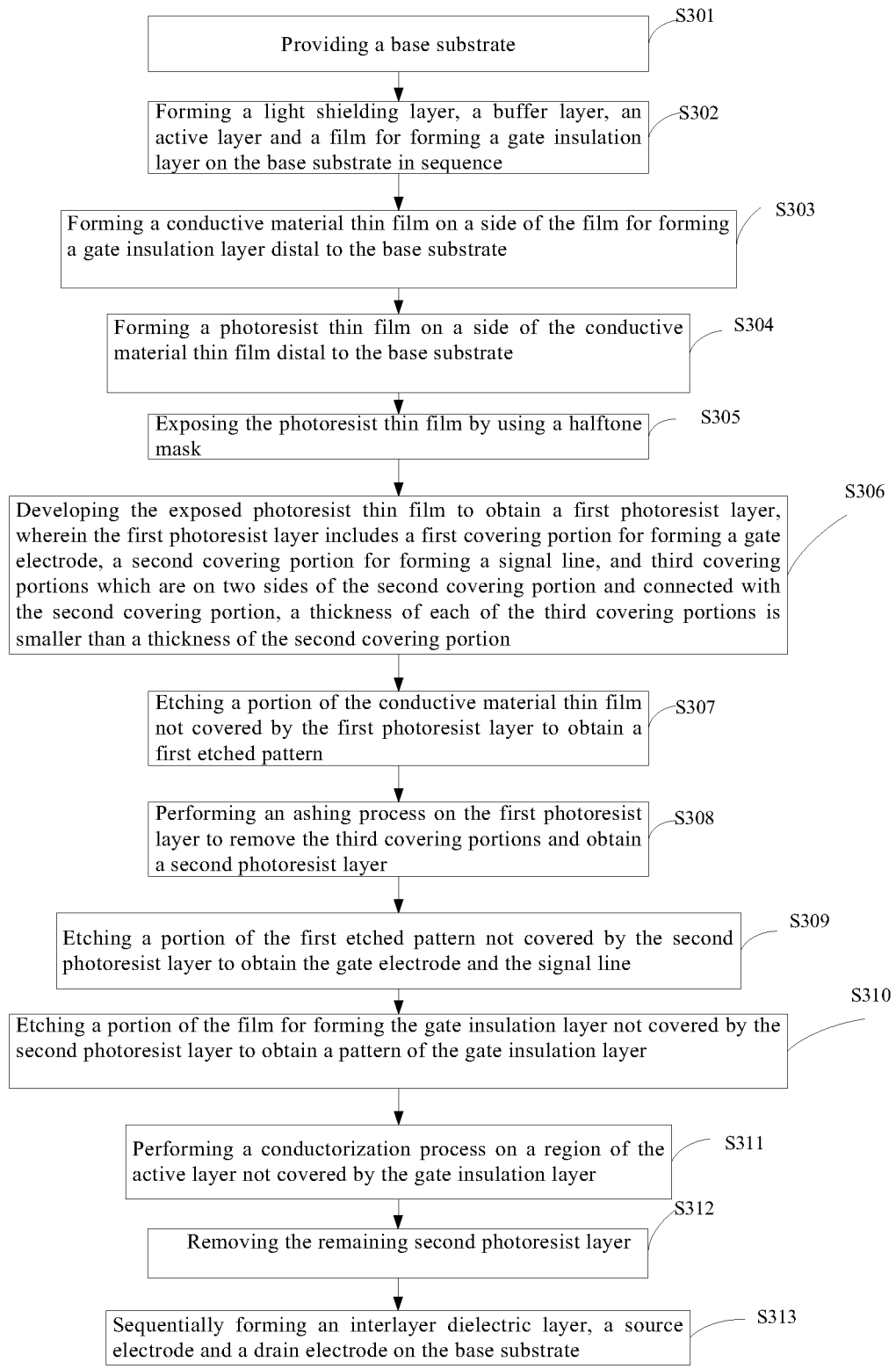
FIG. 3 is a flowchart of a method for manufacturing an array substrate according to an embodiment of the present disclosure.
Figure 4A:
FIGS. 4a to 4n are schematic diagrams showing the structures formed by the method for manufacturing an array substrate shown in FIG. 3.

FIG. 3 is a flowchart of a method for manufacturing an array substrate according to an embodiment of the present disclosure. FIGS. 4a to 4n are schematic diagrams showing structures formed by the method for manufacturing an array substrate shown in FIG. 3. As shown in FIGS. 3 to 4n, the method for manufacturing the array substrate includes step S301 to step S313.

At step S301, a base substrate is provided.

Referring to FIG. 4a, the base substrate 1 may be made of glass, and the cost of glass as the base substrate is low. The base substrate is manufactured at a low temperature less than 500° C., therefore a large area and low cost plate glass can serve as the base substrate to realize a large area.

At step S302, a light shielding layer, a buffer layer, an active layer and a gate insulation material for forming a gate insulation layer are sequentially formed on the base substrate.

Figure 4B:
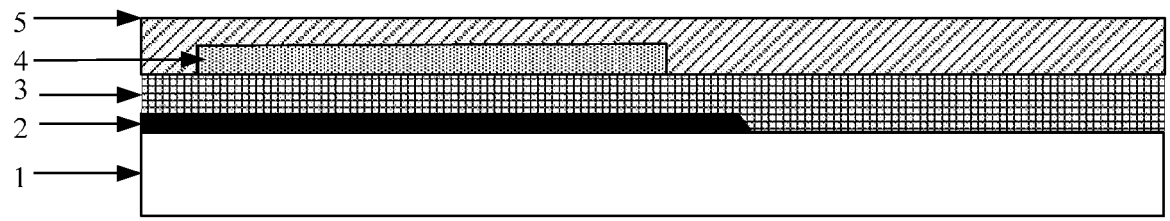

Referring to FIG. 4b, the light shielding layer 2 may be formed on a side of the base substrate 1 by using a related patterning process. The light shielding layer 2 is made of a metal light-shielding material, such as Mo or Al/Mo laminated metal. The light shielding layer 2 completely covers a region where a thin film transistor is to be formed subsequently. In this embodiment, the purpose of light shielding and electrical connection can be achieved by using the light shielding layer 2.

After the light shielding layer 2 is formed, the buffer layer 3 covering throughout an upper surface of the base substrate is formed on a side of the light shielding layer 2 distal to the base substrate 1. The buffer layer 3 can protect the light shielding layer, and the buffer layer 3 includes the material of silicon oxide.

Referring to FIG. 4b, firstly, an active layer material film is formed on a side of the buffer layer 3 distal to the base substrate 1. Optionally, the material of the active layer material thin film is an oxide semiconductor material. And then, a patterning process is performed on the active layer material thin film once to obtain the active layer 4.

Specifically, at step S302, the material of the active layer 4 includes indium gallium zinc oxide. Indium gallium zinc oxide as a novel semiconductor material has higher electron mobility than that of amorphous silicon. Indium gallium zinc oxide serves as a channel material in a new generation of high performance thin film transistor, thereby improving the resolution of a display panel and making it possible for a large-screen OLED (Organic Light-Emitting Diode) television.

It should be noted that the patterning process in the present disclosure generally includes processes such as photoresist coating, exposing, developing, etching, and photoresist removing.

Referring to FIG. 4b, the gate insulation material 5 is formed on a side of the active layer 4 distal to the base substrate 1, and the gate insulation material 5 may be used for forming a gate insulation layer 51.

At step S303, a conductive material thin film is formed on a side of the gate insulation material distal to the base substrate.

Figure 4C:
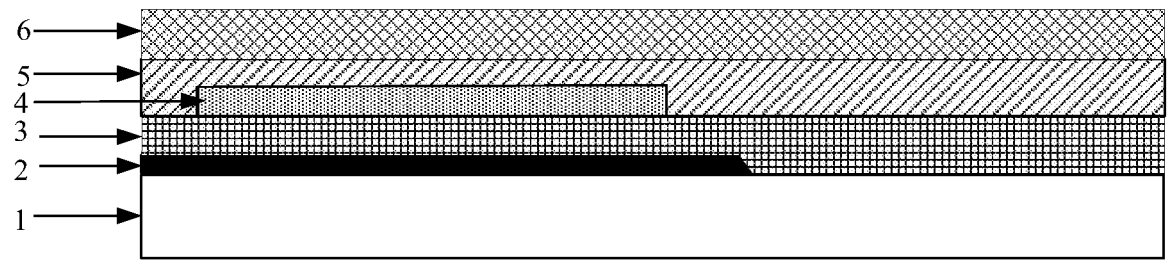

Referring to FIG. 4c, the conductive material thin film 6 is formed on the side of the gate insulation material 5 distal to the base substrate 1, and the conductive material thin film 6 can be used for forming a gate electrode 63 and a signal line 64.

The signal lines include wirings of the TFTs, power lines and wirings of sensors.

At step S304, a photoresist thin film is formed on a side of the conductive material thin film distal to the base substrate.

Figure 4D:
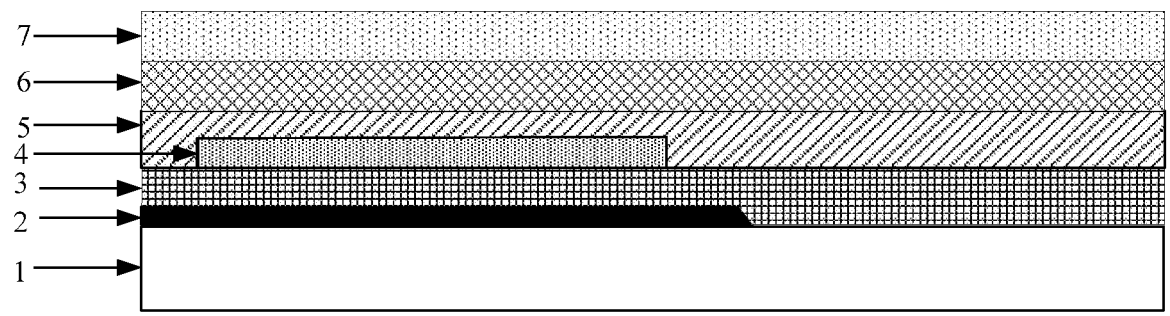

Referring to FIG. 4d, the photoresist thin film 7 is formed on a side of the conductive material thin film 6 distal to the base substrate 1.

At step S305, the photoresist thin film 7 is exposed by using a halftone mask.

Figure 4E:
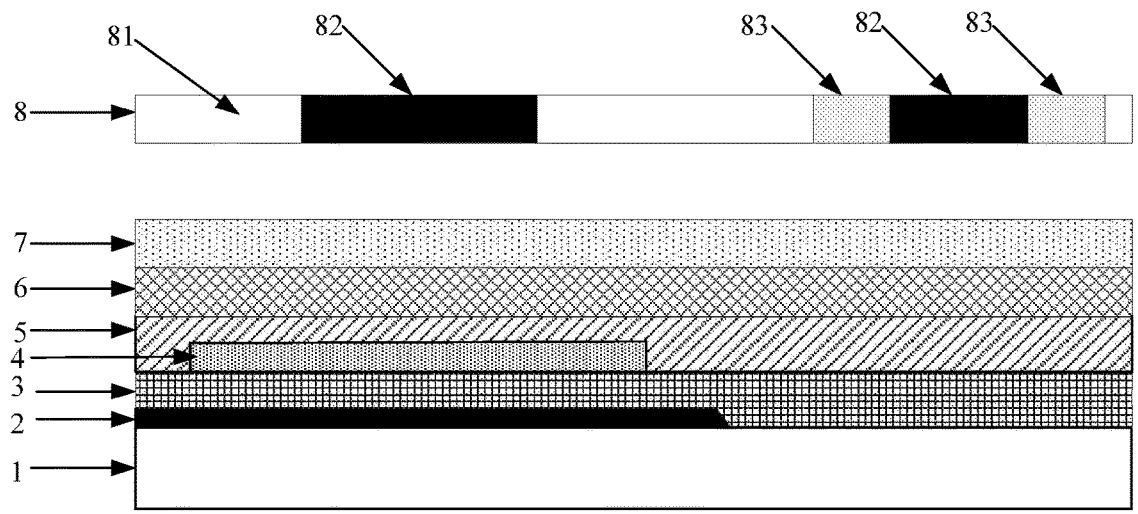

Referring to FIG. 4e, the halftone mask 8 includes: a complete-light-transmitting region 81, light shielding regions 82 and semi-light-transmitting regions 83. At least two light shielding regions 82 are provided, and the two light shielding regions 82 respectively correspond to a region for forming the gate electrode and a region for forming the signal line on the photoresist thin film 7. At least two semi-light-transmitting regions 83 are provided, and the two semi-light-transmitting regions 83 are located on two sides of the light shielding region 82 corresponding to the region for forming the signal line on the photoresist thin film 7. An orthographic projection of a first light shielding region of the two light shielding regions on the base substrate overlaps an orthographic projection of the gate electrode to be formed on the base substrate, and an orthographic projection of a second light shielding region of the two light shielding regions on the base substrate overlaps an orthographic projection of the signal line to be formed on the base substrate.

At step S306, the exposed photoresist thin film is developed to obtain a first photoresist layer. The first photoresist layer includes a first covering portion for forming a gate electrode, a second covering portion for forming a signal line and third covering portions located on two sides of the second covering portion. A thickness of each of the third covering portions is smaller than that of the second covering portion.

Figure 4F:
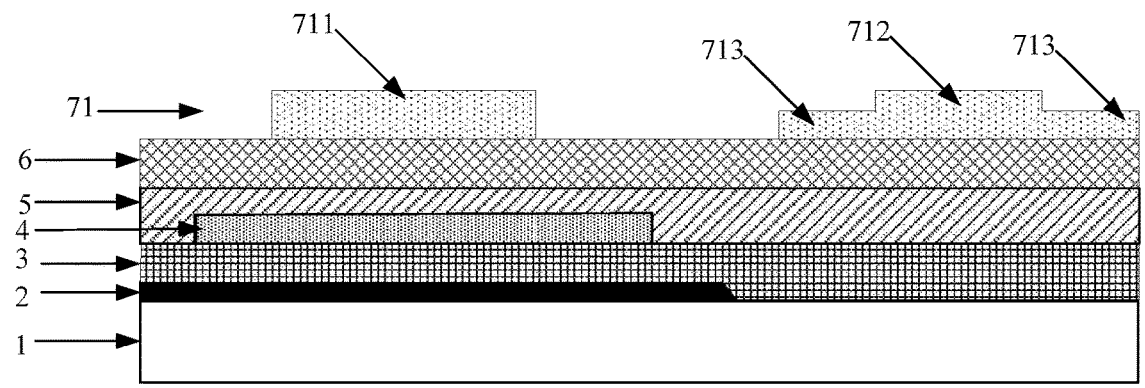

Referring to FIG. 4f, the first photoresist layer 71 includes a first covering portion 711 for forming a gate electrode, a second covering portion 712 for forming a signal line, and third covering portions 713 located at both sides of the second covering portion 712 and connected to the second covering portion 712. The thickness of each of the third covering portions 713 is smaller than that of the second covering portion 712. In this embodiment, since the thickness of each of the third covering portions is smaller than that of the second covering portion, it is possible to remove the third covering portions while maintaining the second covering portion during the subsequent ashing process performed on the third covering portion.

At step S307, the conductive material thin film is etched by using the first photoresist layer as a mask to obtain a first etched pattern.

Figure 4G:
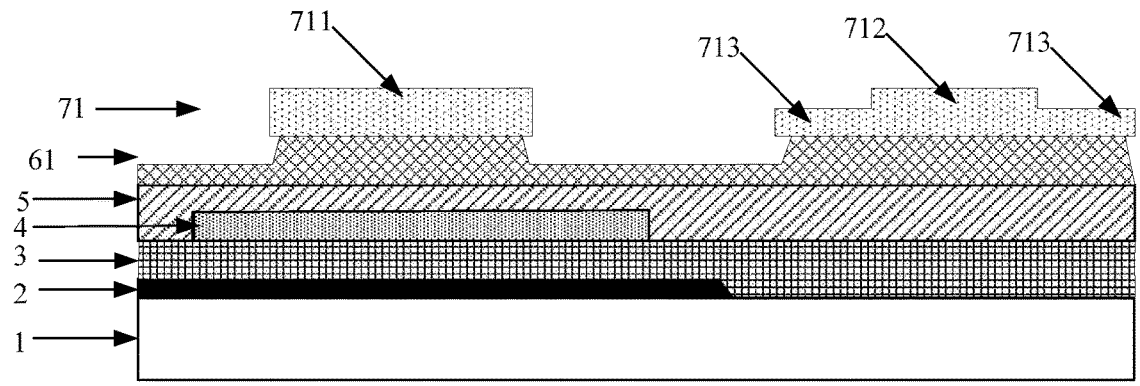

Referring to FIG. 4g, the conductive material thin film 6 is etched by using the first photoresist layer 71 as a mask, so as to obtain the first etched pattern 61. The first etched pattern 61 completely covers the gate insulation material 5, or an orthographic projection of the first etched pattern 61 on the base substrate extends throughout the base substrate without exposing the gate insulation material 5. The first etched pattern 61 has two portions, of which one portion corresponds to the region of the conductive material thin film 6 where the gate electrode is formed, and the other portion corresponds to a region of the conductive material thin film 6 where the signal line is formed.

At step S308, an ashing process is performed on the first photoresist layer to remove the third covering portions and obtain a second photoresist layer.

Figure 4H:
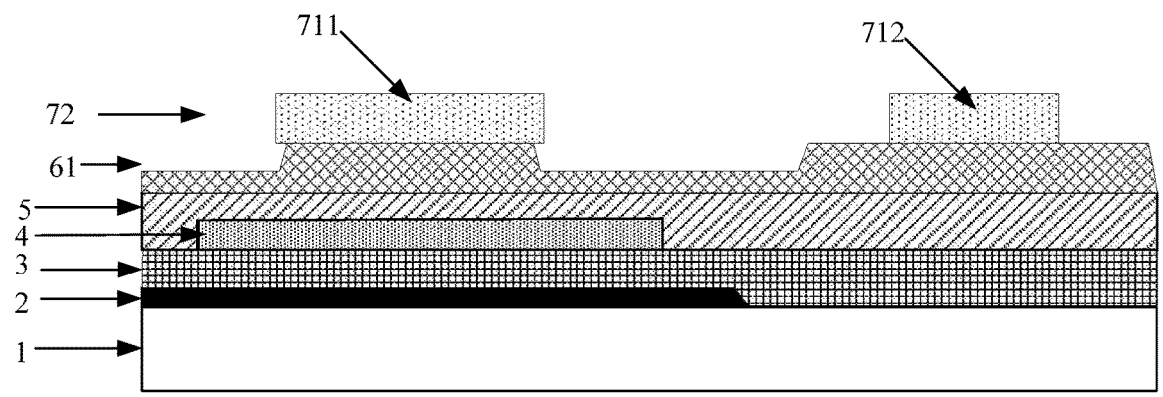

Referring to FIG. 4h, the ashing process is performed on the first photoresist layer 71 to remove the third covering portions 713 and obtain the second photoresist layer 72. The second photoresist layer 72 does not have the third covering portions as compared to the first photoresist layer 71.

At step S309, the first etched pattern is etched by using the second photoresist layer as a mask to obtain the gate electrode and the signal line.

Figure 4I:
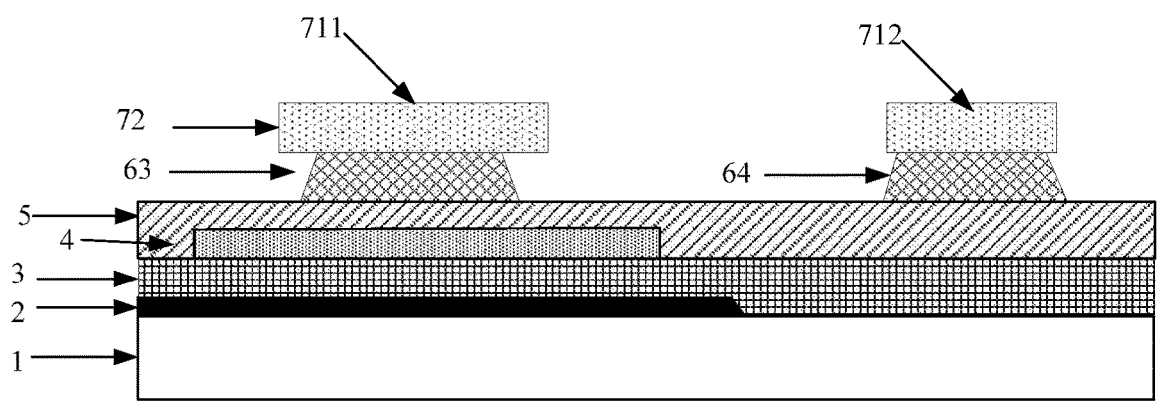

Referring to FIG. 4i, the first etched pattern 61 is etched by using the second photoresist layer 72 as a mask until the gate insulation material 5 is exposed, so as to obtain the gate electrode 63 and the signal line 64.

It can be seen that the gate electrode 63 is etched twice, and the total etching time is long and removed portions at the left and right ends of the gate 63 as shown in FIG. 4i are large, so that the difference between the line width of the etched gate electrode and the line width of the photoresist (e.g., the first covering portion 711) is large; whereas the signal line 64 is etched once, and the etching time is short, so that the difference between the line width of the etched signal line and the line width of the photoresist (e.g., the second covering portion 712) is small, thereby preventing the high frequency of wire break due to too narrow line width of the signal line, enhancing the conductivity of the signal line, and improving the quality of display products.

At step S310, the gate insulation material is etched by using the second photoresist layer 72 as a mask to obtain a gate insulation layer.

Specifically, at step S310, the gate insulation material may be etched through a self-alignment process. The gate insulation material is dry-etched through the self-alignment process by using the second photoresist layer with micron-scale line width as a mask, to realize the self-alignment between the second photoresist layer 72 and the gate insulation layer 51.

Figure 4J:
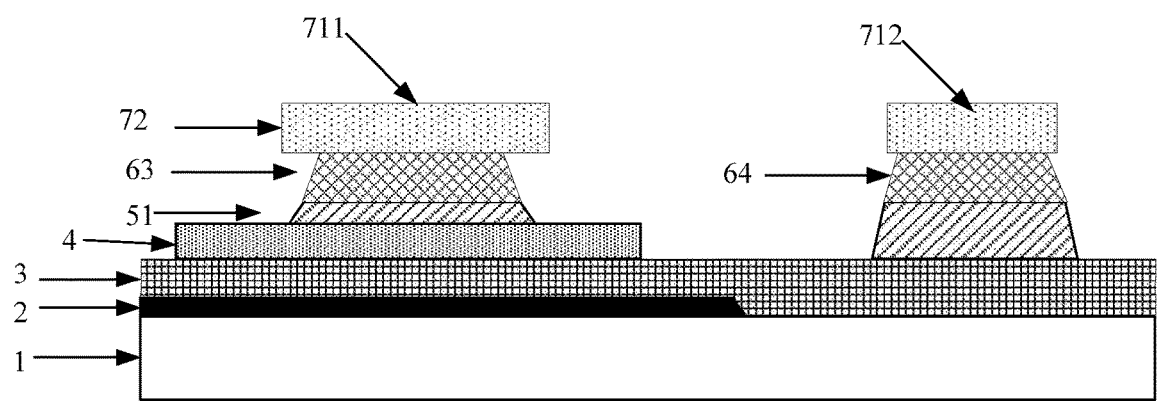

Referring to FIG. 4j, the gate insulation material 5 is etched by using the second photoresist layer 72 as a mask to obtain the gate insulation layer 51.

At step S311, a conductorization process is performed on regions of the active layer which are not covered by the gate insulation layer.

Figure 4K:
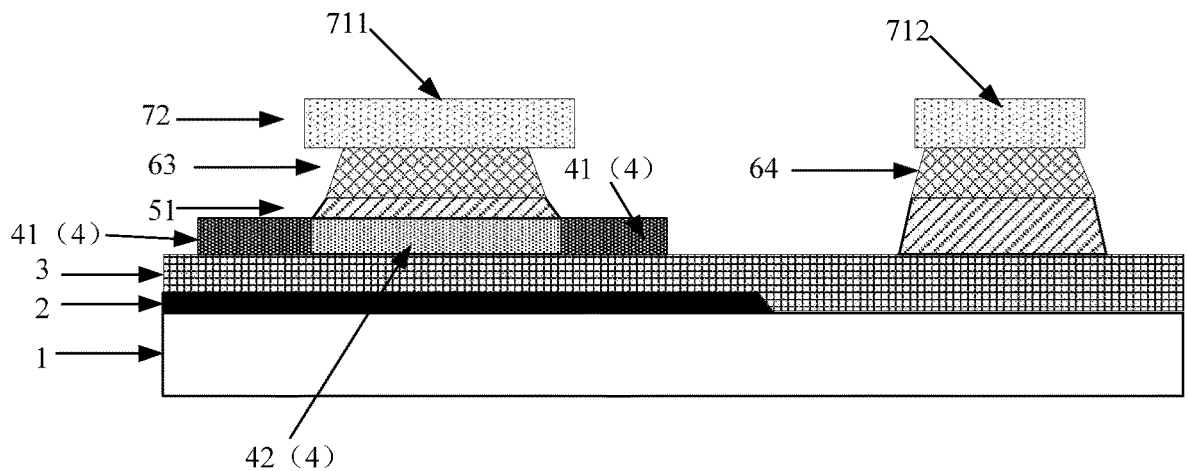

Referring to FIG. 4k, a plasma implantation process is performed on portions 41 of the active layer 4 which are not covered by the gate insulation layer 51 so as to realize the conductor process on the portions.

At this time, the portions 41 of the active layer 4 which are not covered by the gate insulation layer 51 serve as conductor regions for subsequent connection with the source electrode and drain electrode. A portion 42 of the active layer 4 covered by the gate insulation layer 51 serves as a channel region.

According to the method for manufacturing the array substrate, the difference between the line width of the etched gate electrode 63 and the line width of the photoresist thin film 7 is large, the gate insulation layer 51 below the gate electrode 63 is etched through the self-alignment process, and then the conductorization process is performed on the active layer 4, thereby preventing the plasma from laterally diffusing in a channel of the active layer and metal atoms in the gate electrode above the active layer from diffusing into the channel through two sides of the active layer during the conductorization process.

At step S312, the second photoresist layer is removed.

Figure 4L:
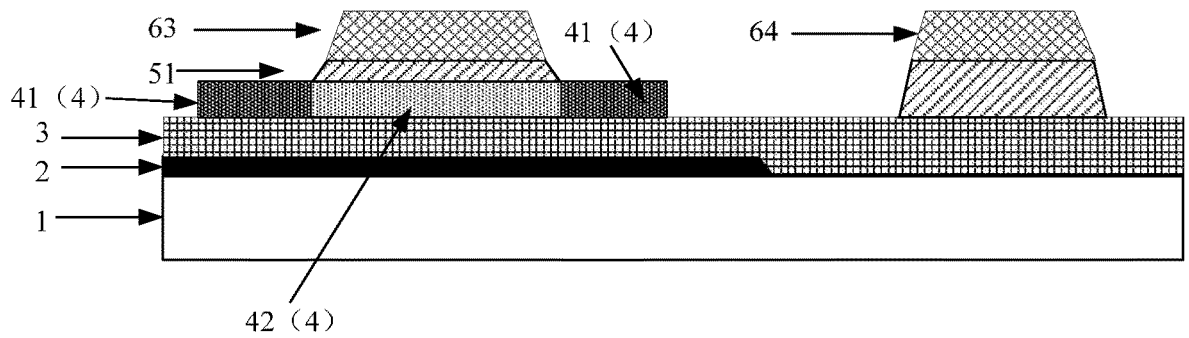

Referring to FIG. 4l, the second photoresist layer 72 is removed.

At step S313, an interlayer dielectric layer, a source electrode and a drain electrode are sequentially formed on the base substrate.

Figure 4M:
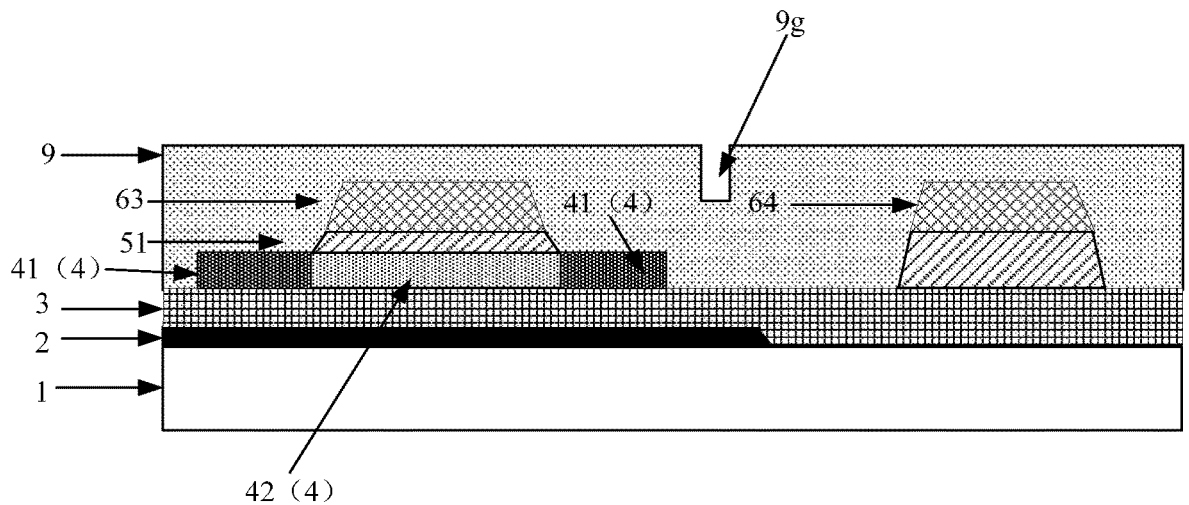
Figure 4N:
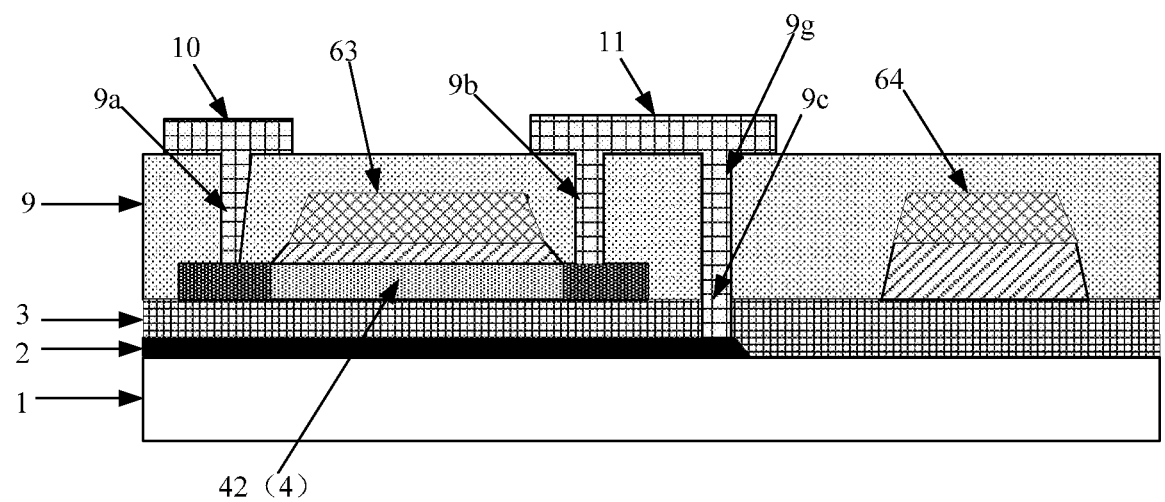

Referring to FIG. 4m, firstly, the interlayer dielectric layer material thin film is formed on a side of the gate electrode 63 distal to the base substrate 1; secondly, a patterning process is performed on the interlayer dielectric layer material thin film once to obtain an interlayer dielectric layer 9; and then a patterning process is performed on the interlayer dielectric layer 9 once to form a transition hole 9g in the interlayer dielectric layer 9.

Referring to FIG. 4n, a patterning process is performed on the interlayer dielectric layer 9 again to form a first through hole 9a, a second through hole 9b, and a third through hole 9c in the interlayer dielectric layer 9. The third through hole 9c is obtained by the patterning process on the basis of the transition hole 9g, and the third through hole 9c sequentially penetrates through the interlayer dielectric layer 9 and the buffer layer 3, and is connected with the light shielding layer 2.

When a source electrode and a drain electrode are formed, a source-drain metal film is formed on a side of the interlayer dielectric layer 9 distal to the base substrate 1; and then a patterning process is performed on the source-drain metal film once to obtain the source electrode 10 and the drain electrode 11. The source electrode 10 is connected with the active layer 4 through the first through hole 9a, the drain electrode 11 is connected with the active layer 4 through the second through hole 9b, and the drain electrode 11 is further connected with the light shielding layer 2 through the transition hole 9g and the third through hole 9b in sequence.

The array substrate obtained by the embodiment of the disclosure includes the top-gate type TFT which has the characteristic of a short channel, therefore the on-state current of the TFT can be effectively improved, the display effect can be greatly improved, and the power consumption can be effectively reduced. Since an overlapping area of the gate electrode with the source/drain electrode of the top-gate type TFT is small, and thus the parasitic capacitance generated is small.

Further, in order to protect the source electrode 10 and the drain electrode 11, a passivation layer (not shown) may be formed on a side of the source electrode 10 and the drain electrode 11 distal to the base substrate 1. Specifically, a passivation layer material thin film is firstly formed on the side of the source electrode 10 and the drain electrode 11 distal to the base substrate 1; and then a patterning process is performed on the passivation layer material thin film to obtain the passivation layer.

According to the method for manufacturing an array substrate provided by the embodiment of the disclosure, on one hand, the method can effectively prevent the helium plasma from laterally diffusing in a channel of the active layer and metal atoms in the gate electrode above the active layer from diffusing into the channel through two sides of the active layer during the conductorization process of the active layer, thereby ensuring the stability of the characteristics of the TFT; on the other hand, the method can enhance the conductivity of the signal line, and prevent the high frequency of wire break due to too narrow line width after etching.

The present disclosure further provides an array substrate, which is manufactured by the method for manufacturing an array substrate according to any one of the above embodiments.

The present disclosure further provides a display device including an array substrate, and the array substrate is the array substrate according to the foregoing embodiment. The detailed description of the display device may refer to the contents in the foregoing embodiment, which is not described herein again.

It should be understood that the above implementations are merely exemplary embodiments for the purpose of illustrating the principles of the present disclosure, however the present disclosure is not limited thereto. It will be apparent to those skilled in the art that various changes and modifications can be made without departing from the spirit and spirit of the present disclosure, which are also to be regarded as falling within the scope of the present disclosure.

What is claimed is:

1. A method for manufacturing an array substrate, comprising:
    providing a base substrate;

forming a conductive material thin film on the base substrate;

forming a first photoresist layer on a side of the conductive material thin film distal to the base substrate, wherein the first photoresist layer comprises a first covering portion corresponding to a gate electrode, a second covering portion corresponding to a signal line, and third covering portions which are respectively on two sides of the second covering portion and connected with the second covering portion, and a thickness of each of the third covering portions is smaller than a thickness of the second covering portion;

etching the conductive material thin film by using the first photoresist layer comprising the first covering portion, the second covering portion, and the third covering portions as a mask to obtain a first etched pattern of the conductive material thin film;

removing the third covering portions of the first photoresist layer to obtain a second photoresist layer, after the conductive material thin film is etched; and etching the first etched pattern of the conductive material thin film by using the second photoresist layer comprising only the first covering portion and the second covering portion as a mask to obtain the gate electrode and the signal line, after the third covering portions of the first photoresist layer are removed.

2. The method according to claim 1, wherein forming the first photoresist layer on the side of the conductive material thin film distal to the base substrate comprises:

forming a photoresist thin film on the side of the conductive material thin film distal to the base substrate, exposing the photoresist thin film by using a halftone mask, and developing the exposed photoresist thin film to obtain the first photoresist layer.

3. The method according to claim 2, wherein removing the third covering portions of the first photoresist layer comprises: performing an ashing process on the first photoresist layer to remove the third covering portions of the first photoresist layer.

4. The method according to claim 3, wherein etching the conductive material thin film by using the first photoresist layer as a mask to obtain a first etched pattern comprises: etching the conductive material thin film by using the first photoresist layer as a mask, such that an orthographic projection of the first etched pattern on the base substrate extends throughout the base substrate.

5. The method according to claim 2, wherein
the halftone mask comprises a complete-light-transmitting region, two light shielding regions and two semi-light-transmitting regions, an orthographic projection of a first light shielding region of the two light shielding regions on the base substrate overlaps an orthographic projection of the gate electrode on the base substrate, an orthographic projection of a second light shielding region of the two light shielding regions on the base substrate overlaps an orthographic projection of the signal line on the base substrate, and the two semi-light-transmitting regions are respectively on two sides of the second light shielding region.

6. The method according to claim 4, wherein before forming the conductive material thin film on the base substrate, the method further comprises:

sequentially forming a light shielding layer, a buffer layer, an active layer and a gate insulation material on the base substrate.

7. The method according to claim 6, wherein after etching the first etched pattern by using the second photoresist layer as a mask to obtain the gate electrode and the signal line, the method further comprises:

etching the gate insulation material by using the second photoresist layer as a mask to obtain a gate insulation layer.

8. The method according to claim 7, wherein etching the gate insulation material by using the second photoresist layer as a mask to obtain the gate insulation layer comprises: etching the gate insulation material through a self-alignment process.

9. The method according to claim 8, wherein after etching the gate insulation material by using the second photoresist layer as a mask to obtain the gate insulation layer, the method further comprises:

performing a conductorization process on a region of the active layer not covered by the gate insulation layer, and removing the second photoresist layer.

10. The method according to claim 9, wherein after performing the conductorization process on the region of the active layer not covered by the gate insulation layer, the method further comprises:

sequentially forming an interlayer dielectric layer, a source electrode and a drain electrode on the base substrate.

11. The method according to claim 6, wherein
the active layer is made of indium gallium zinc oxide.

12. An array substrate, wherein the array substrate is manufactured by the method according to claim 1.

13. A display device comprising the array substrate according to claim 12.

* * * * *